United States Patent [19]

Wu et al.

[11] Patent Number: 4,898,650

[45] Date of Patent: * Feb. 6, 1990

[54] LASER CLEANING OF METAL STOCK

[75] Inventors: Jeff C. Wu, Clemmons; George B. Cvijanovich; Richard T. Williams, both of Winston-Salem, all of N.C.

[73] Assignee: AMP Incorporated, Harrisburg, Pa.

[*] Notice: The portion of the term of this patent subsequent to May 23, 2006 has been disclaimed.

[21] Appl. No.: 197,773

[22] Filed: May 10, 1988

[51] Int. Cl.$^4$ ............................ C25D 5/34; B05D 3/06
[52] U.S. Cl. ...................................... 204/29; 204/32.1; 204/33; 204/34; 204/157.15; 204/157.41; 427/53.1; 134/1
[58] Field of Search ............... 204/29, 32.1, 33, 34, 204/157.41, 157.15; 427/53.1; 134/1

[56] References Cited

U.S. PATENT DOCUMENTS

| | | | |
|---|---|---|---|
| 4,028,135 | 6/1977 | Vig | 134/1 |
| 4,063,063 | 12/1977 | Funck | 134/1 |
| 4,340,617 | 7/1982 | Deutsch | 204/157.41 |
| 4,348,263 | 9/1982 | Draper et al. | 204/29 |
| 4,349,583 | 9/1982 | Kulyrych | 204/157.41 |
| 4,368,080 | 1/1983 | Langen | 134/1 |
| 4,490,211 | 12/1984 | Chen et al. | 156/643 |
| 4,495,255 | 1/1985 | Draper | 427/53.1 |
| 4,659,587 | 4/1987 | Imura | 427/53.1 |
| 4,832,798 | 5/1989 | Cvijanovich | 204/15 |

Primary Examiner—John F. Niebling
Assistant Examiner—Ben C. Hsing
Attorney, Agent, or Firm—William B. Noll

[57] ABSTRACT

A method of cleaning a metal surface by means of a laser to improve the surface characteristics, prior to plating thereover with a noble metal, such as gold. More particularly, the method hereof includes the steps of illuminating the desired areas of said metal surface with a laser beam; provided, however, the laser power density is controlled to vaporize surface contaminants and embedded foreign materials, without significantly altering the properties of the metal, in preparation for plating said cleaned areas with said noble metal.

4 Claims, No Drawings

LASER CLEANING OF METAL STOCK

FIELD OF THE INVENTION

The invention relates to a method for laser treating a metal substrate, preferably a substrate to be plated by a noble metal, where said substrate typically comprises an electrically conductive metal, such as nickel plated phosphor bronze, unplated phosphor bronze, or beryllium copper. Said laser treatment is for the purpose of cleaning said substrate to improve electrical contact properties.

DESCRIPTION OF THE PRIOR ART

Many industrial applications require the use of a noble metal plating over a base metal to resist the effects of corrosion and surface contamination due to the exposure of such base metal to certain environmental conditions. One of the most important specific instances in which a noble metal plating must be employed is in conjunction with electrical terminals which interconnect various electrical components. Many conventional electrical components employ an electrically conductive metal contact, where such metal possesses certain spring characteristics, with the electrical interconnection being maintained by the engagement of the contacts through reliance on such spring characteristics. However, in order to maintain a satisfactory electrical connection in the presence of corrosion or contamination of the electrical contact terminals, a noble metal plating must often be applied to the surface of the base metal. Quite commonly, a gold or gold alloy plating is applied over a copper or copper alloy electrical terminal. In order to prevent intermetallic diffusion of the copper or copper alloy into the gold or gold alloy, an intermediate nickel layer is conventionally employed. Accordingly, the preferred base metal for gold or precious metal plating a composite of nickel over copper.

Gold, gold alloys and other precious metals, as contact metals, are characterized by good electrical conductivity with little or no formation of oxides that may reduce such conductivity. While such precious metals are now established as desirable contact surfaces for electrical contacts, research efforts have been directed at improving contact properties, while at the same time conserving such precious metals. Copending application, Ser. No. 133,779, now U.S. Pat. No. 4,832,798, assigned to the assignee herein, teaches apparatus, and the method of using same, to minimize the need for a thick layer of the plated precious metal by treating the surface of the composite to reduce its porosity, prior to coating such surface.

In other work directed to improving contact properties, reference is made to U.S. Pat. No. 4,348,263, a patent by Draper et al, directed to a process for surface melting of a substrate prior to plating. Such patent teaches a method of making an electrical contact by the steps of applying a first protective layer to a substrate, subjecting said protective layer and a portion of said substrate to melting by means of an electron beam or laser prior to the deposition. More particularly, such patent is directed to the improvement of macroscopic surface roughness of features, on the order of ten micrometers, of electrical components, such as switch contacts, integrated circuit contacts, relay contacts, and printed circuit board contacts having a copper alloy substrate, by melting the substrate with radiant energy.

In addition to changing the macroscopic surface characteristics, microscopic structural changes on the order of less than ten micrometers were found to reduce grain size and thereby affect diffusion of the substrate base layer through a plating layer. Gold, which has been electroplated over copper alloys prepared by the technique described in U.S. Pat. No. 4,348,263, has shown improved resistance to sulfur and chlorine corrosion. Continuous wave lasers can be moved across the surface to produce melting, or by a pulsed radiation beam. Typically a Q-switched neodymium yttrium aluminum garnet (YAG) laser was used. According to such patent, for a nickel substrate, a melt time of ten milliseconds was found to result in a maximum melt depth of 0.1 millimeters, while a melt time of five microseconds resulted in a maximum melt depth of 2.5 micrometers. The duration of laser pulses employed in the technique described in U.S. Pat. No. 4,348,263 is generally on the order of microseconds, but in any event is less than ten milliseconds.

For additional background information, reference is made to a related work by Draper, published in the Gold Bulletin, 1986, 19, entitled "Laser Surface Alloying of Gold," contains an illustration showing on the mechanism of laser surface alloying by the use of focussed laser pulsing.

Melting or reflowing of the surface metal is not the total answer for all contact problems, such as impurities. For example, one inherent shortcoming of certain composite contact surfaces, resulting from the manufacture and processing of the material therefore, is the presence of surface contaminants and imbedded foreign materials. Such contaminants and materials, even with highly conductive gold thereover, can interfere with the conductivity properties of the contacts.

The present invention, through laser treating of the metal surface prior o final plating, improves the surface characteristics by removing surface contaminants and embedded foreign materials therefrom. The method by which this is accomplished will become clearer from a reading of the specification which follows.

SUMMARY OF THE INVENTION

This invention is directed to a method of cleaning a metal surface by means of a laser to improve the surface characteristics, prior to plating thereover with a noble metal, such as gold. More particularly, the method hereof includes the steps of illuminating the desired areas of said metal surface with a laser beam, where preferred parameters for such laser beam are as follows:

| Laser Parameters |
| --- |
| $\lambda$ = 193 to 351 nm |
| pulse width = 20 nsec |
| energy density = 1 to 1.5 J/cm$^2$ | so as to control the vaporization of surface contaminants and imbedded foreign materials, without significantly altering the properties of the metal surface. Such cleaned metal surface is particularly suitable for plating with said noble metal.

DETAILED DESCRIPTION OF PREFERRED EMBODIMENT

The invention relates principally to a method for treating a metal surface by focusing a laser thereon to improve the characteristics of such surface. Said laser treatment is for the purpose of cleaning said metal surface to remove oxides and embedded organic and inorganic contaminants, whereby to improve its contact properties, when subsequently plated thereover by a noble metal.

In the field of laser applications there are several commercial units which operate at different wave lengths. For example, excimer lasers form a group of pulsed high-pressure gas lasers which emit at four wavelengths, depending on the lasing medium, from 193 nm to 351 nm, in the ultraviolet spectral region. At the opposite end of the spectrum, operating in the infrared region are such lasers whose laser sources are carbon dioxide ($CO_2$), and neodymium doped yttrium-aluminum garnet (Nd:YAG). By way of example and comparison, typical wavelengths ranges or known wavelengths for the three commercial laser units are as follows:

| | |
|---|---|
| Excimer | 193, 248, 308, 351 nm |
| $CO_2$ | 10,600 nm |
| ND:YAG | 1,064 nm |

This invention was the result of an investigation into improving the conductivity of electrical contacts, and the recognition that surface oxides and embedded surface contaminants can affect platability and therefore conductivity. For good electrical conductivity, particularly with the use of precious metals, such as gold, as the contact surface, it is critical to insure optimum plating conditions for such precious metal on a metal substrate. Surface oxide on the metal substrate, typically nickel or phosphor bronze, tends to act as an insulator to the precious metal plated thereover. Embedded contaminants, such as organic and inorganic materials, on the other hand tend to interfere with the bonding of the precious metal to such substrate.

By the appropriate and careful selection of a laser pulse imaged onto said substrate surface, it was discovered that such surface was significantly cleaned to enable suitable plating thereof.

In the practice of this invention, an excimer laser, operable within the wavelength range of 193 to 351 nm, under the following parameters:

| | Broad | Preferred |
|---|---|---|
| a. pulse width | 3-100 nsec. | 15 nsec. |
| b. energy density | 1-3J/cm$^2$ | 1-1.5J/cm$^2$ | imaged at a metal substrate in which such wavelength is partially absorbed, will be sufficient to vaporize both surface contaminants and embedded foreign materials to produce a clean surface suitable for plating.

Typically the surface contaminants which may be encountered are oxides and metal processing lubricants or greases, which may be used in the metal stamping process. Examination of laser surface cleaning by emission spectroscopy has shown that energy densities of from 1-3 J/cm$^2$ are needed to effectively clean said surface. Below about 1 J/cm$^2$ some cleaning will be observed, but a preferred level to ensure adequate and complete cleaning is from 1-1.5 J/cm$^2$. The latter density is particularly suitable for wavelengths between 248 and 351 nm.

The type of substrate, the surface of which is to be cleaned, is preferably selected from metals such as nickel plated phosphor bronze, unplated phosphor bronze, or beryllium copper. A characteristic of each such metal is that the laser wavelength selected herein for practicing this invention, will be absorbed into such metals by at least about 10%.

Cleaning can occur by direct absorption of the laser light in the contaminant, or by absorption of laser light in a thin layer at the surface of the metal, the heated metal layer then vaporizing the contaminant. Both mechanisms may be at work simultaneously. Direct absorption in the contaminant may not be effective if the contaminant does not strongly absorb the laser light. Ultraviolet light is strongly absorbed by more materials than is any other readily available laser wavelength, and is hence preferable for the first mechanism. Heating of the metal in order to vaporize contaminants is more likely to work with a broad range of contaminants, but requires that the metal effectively absorb the laser light, e.g. at least 10%. Again, ultraviolet wavelengths such as obtained from an excimer laser most nearly fit this prescription. For example, nickel is only about 50% reflective (hence about 50% absorptive) at excimer wavelengths.

However, if heating of the metal is used for cleaning, the laser pulse must be very short (less than about 100 ns) so that high temperatures on the surface may be reached without significantly heating the interior. This also works better if the metal has a relatively high melting point.

We claim:

1. A method of cleaning the nickel plated surface of an electrically conductive metal by removing surface contaminants therefrom, by the application of an excimer laser light, where said contaminants strongly absorb the laser light and said nickel plated metal is capable of absorbing laser wavelengths between 193 and 351 nm by at least 10%, comprising the step of subjecting said nickel plated metal to at least a single pulse of a laser emitting at a wavelength between 193 and 351 nm for a controlled length of pulse width of from 3 to 100 nsec. and sufficient energy density to vaporize said contaminants.

2. The method according to claim 1 wherein said laser is operating at a wavelength of from 248 nm to 351 nm.

3. The method according to claim 2 wherein said laser is an excimer laser operating in the ultraviolet spectral region and at an energy density of from 1 to 1.5 J/cm$^2$.

4. The method according to claim 1 wherein said pulse width is from 3 to 15 nsec.

* * * * *